US012610651B2

(12) United States Patent
Li et al.

(10) Patent No.: US 12,610,651 B2
(45) Date of Patent: Apr. 21, 2026

(54) SOLAR CELL AND PHOTOVOLTAIC MODULE

(71) Applicant: LONGI GREEN ENERGY TECHNOLOGY CO., LTD., Xi'an (CN)

(72) Inventors: Zhenguo Li, Xi'an (CN); Hongbo Tong, Xi'an (CN); Yupeng Jin, Xi'an (CN); Yuan Yu, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/098,548

(22) Filed: Apr. 2, 2025

(65) Prior Publication Data

US 2025/0359391 A1 Nov. 20, 2025

Related U.S. Application Data

(63) Continuation of application No. PCT/CN2025/080544, filed on Mar. 4, 2025.

(30) Foreign Application Priority Data

May 15, 2024 (CN) ......................... 202410605390.9
Sep. 12, 2024 (CN) ......................... 202411280473.1

(51) Int. Cl.
  *H10F 77/14* (2025.01)
  *H10F 77/20* (2025.01)
  (Continued)

(52) U.S. Cl.
  CPC ......... *H10F 77/147* (2025.01); *H10F 77/219* (2025.01); *H10F 77/315* (2025.01); *H10F 77/703* (2025.01)

(58) Field of Classification Search
  CPC .... H10F 77/147; H10F 77/703; H10F 77/219; H10F 77/315
  See application file for complete search history.

(56) References Cited

U.S. PATENT DOCUMENTS

2013/0199606 A1 8/2013 Sheng et al.
2015/0075601 A1 3/2015 Adachi et al.
(Continued)

FOREIGN PATENT DOCUMENTS

CN 108110117 A 6/2018
CN 109037359 A 12/2018
(Continued)

OTHER PUBLICATIONS

Office Action in Australian Appln. No. 2025202205, mailed on Aug. 29, 2025, 4 pages.
(Continued)

*Primary Examiner* — Jayne L Mershon
(74) *Attorney, Agent, or Firm* — Fish & Richardson P.C.

(57) ABSTRACT

A solar cell including: a semiconductor substrate having a first surface and a second surface opposite to each other, and a plurality of side surfaces adjacently connected between the first and the second surfaces; a passivated contact structure, located on a part of the first surface, including an interface passivation layer and a first doped semiconductor layer that are sequentially stacked. In a direction from the first surface to the second surface, respective side surface of the plurality of side surfaces includes a first region and a second region that are sequentially adjacent. The first region protrudes in a direction away from the respective side surface relative to the second region. The first doped semiconductor layer is located on a surface of the first region. The first doped
(Continued)

semiconductor layer located in the first region and the first doped semiconductor layer located on the first surface are integrally continuous.

14 Claims, 11 Drawing Sheets

(51) Int. Cl.
  *H10F 77/30*          (2025.01)
  *H10F 77/70*          (2025.01)

(56)              References Cited

U.S. PATENT DOCUMENTS

| | | | |
|---|---|---|---|
| 2016/0133779 A1 | 5/2016 | Adachi et al. | |
| 2016/0155866 A1* | 6/2016 | Ha | H10F 77/311 |
| | | | 136/255 |
| 2016/0293785 A1 | 10/2016 | Pei et al. | |
| 2023/0317866 A1 | 10/2023 | Chen et al. | |
| 2024/0063324 A1 | 2/2024 | Liu et al. | |
| 2024/0322066 A1 | 9/2024 | Ma | |
| 2024/0347653 A1 | 10/2024 | Liu et al. | |
| 2024/0347661 A1* | 10/2024 | Yang | H10F 10/166 |
| 2024/0387768 A1* | 11/2024 | Liu | H10F 77/703 |

FOREIGN PATENT DOCUMENTS

| | | |
|---|---|---|
| CN | 112599617 A | 4/2021 |
| CN | 113302747 A | 8/2021 |
| CN | 113471321 A | 10/2021 |
| CN | 113488384 A | 10/2021 |
| CN | 114583013 A | 6/2022 |
| CN | 116031142 A | 4/2023 |
| CN | 116613224 A | 8/2023 |
| CN | 116314382 B | 9/2023 |
| CN | 116613224 B | 9/2023 |
| CN | 116682886 A | 9/2023 |
| CN | 117352567 A | 1/2024 |
| CN | 117423754 A | 1/2024 |
| CN | 117423760 A | 1/2024 |
| CN | 117577704 A | 2/2024 |
| CN | 220526937 U | 2/2024 |
| CN | 117637874 A | 3/2024 |
| CN | 117790589 A | 3/2024 |
| CN | 117954518 A | 4/2024 |
| CN | 118335817 A | 7/2024 |
| CN | 118398687 A | 7/2024 |
| CN | 119421557 A | 2/2025 |
| CN | 119421557 B | 7/2025 |
| KR | 10-1702953 B1 | 2/2017 |
| KR | 10-2018-0043150 A | 4/2018 |

OTHER PUBLICATIONS

Office Action in Chinese Appln. No. 202411280473.1, dated Apr. 6, 2025, 15 pages (with English translation).

Search Report in Chinese Appln. No. 202411280473.1, dated Jun. 27, 2025, 5 pages (with machine translation).

Extended European Search Report in European Appln. No. 25716024.2, mailed on Dec. 22, 2025, 9 pages.

International Search Report and Written Opinion in International Appln. No. PCT/CN2025/080544, mailed on Jun. 3, 2025, 22 pages (with machine translation).

Office Action in Australian Appln. No. 2025202205, mailed on May 14, 2025, 3 pages.

Office Action and Search Report in Chinese Appln. No. 202410605390.9, dated Sep. 7, 2024, 30 pages (with English translation).

Office Action in Chinese Appln. No. 202410605390.9, dated Nov. 30, 2024, 30 pages (with English translation).

Wang et al., "Study on the cleaning process of n+-poly-Si wrap-around removal of TOPCon solar cells," Solar Energy, Sep. 2020, 211(2020):324-335.

Zhou, "Photovoltaic Technology and Application Principles," China Central Radio & TV University Press, Aug. 2011, 3 pages (with English translation).

* cited by examiner

SOLAR CELL AND PHOTOVOLTAIC MODULE

CROSS-REFERENCE TO RELATED APPLICATIONS

This application is a continuation application of PCT Application No. PCT/CN2025/080544, filed on Mar. 4, 2025, which claims priority to Chinese Patent Application Nos. 202411280473.1, filed on Sep. 12, 2024 and 202410605390.9, filed on May 15, 2024. The disclosures of the aforementioned applications are hereby incorporated by reference in their entireties.

TECHNICAL FIELD

The present application relates to the technical field of solar cells, and in particular, to a solar cell and a photovoltaic module.

BACKGROUND

In the related art, a solar cell includes an N-type region and a P-type region. The N-type region and the P-type region need to be electrically separated to a certain extent. Generally, the N-type region and the P-type region may be separated by using a process such as wet etching. However, an existing manner is not perfect, and there is still a risk of leakage between a front surface and a back surface of the solar cell.

In addition, during transport, edges of the solar cell easily rub against each other. As a result, a passivation film layer falls off or is scuffed, and consequently, a substrate is exposed to the outside. In this case, a surface passivation layer is damaged. As a result, passivation performance of the solar cell is reduced, and consequently, performance of the solar cell is affected.

SUMMARY

In view of this, a solar cell and a photovoltaic module including the solar cell need to be provided for a defect of the solar cell in the related art.

According to embodiments of an aspect of the present application, a solar cell is provided, including:

a semiconductor substrate, where the semiconductor substrate has a first surface and a second surface that are opposite to each other and a plurality of side surfaces adjacently connected between the first surface and the second surface; and a passivated contact structure, at least located on a part of the first surface of the semiconductor substrate, the passivated contact structure including an interface passivation layer and a first doped semiconductor layer that are sequentially stacked.

In a direction from the first surface to the second surface, respective side surface of the plurality of side surfaces includes a first region and a second region that are sequentially adjacent. The first region protrudes in a direction away from the respective side surface relative to the second region. The first doped semiconductor layer is further located on a surface of the first region. A part of the first doped semiconductor layer located in the first region and another part of the first doped semiconductor layer located on the first surface are integrally continuous.

According to the solar cell provided in the foregoing embodiments of the present application, in the direction parallel to the first surface, the first region of at least one of the side surfaces protrudes in the direction away from the respective side surface relative to the second region, which is conducive to improving an effective area of the passivated contact structure on the first surface, so that passivated contact performance of the first surface and carrier collection efficiency are improved, thereby improving the efficiency of the solar cell.

According to the solar cell provided in the foregoing embodiments of the present application, in the direction parallel to the first surface, the first region of at least one of the side surfaces protrudes in the direction away from the respective side surface relative to the second region. Since there is a distance between a surface of a protrusion of the first region and a surface of the second region (a space electrical isolation distance between the first surface and the second surface), electrical isolation between the front surface and the back surface of the solar cell can be enhanced, and a risk of leakage between the front surface and the back surface is reduced. In addition, during preparation of an electrode, a case in which slurry configured to prepare the electrode is leaked and distributed in a larger range on the side surface of the solar cell, causing a severe damage to electrical performance of the solar cell, can also be effectively avoided. Moreover, protruding of the first region can reduce a damage to performance of the solar cell that is caused when the solar cell is scratched.

According to the solar cell provided in the foregoing embodiments of the present application, the first doped semiconductor layer is further located on a part of the surface of the first region, so that the effective area of the passivated contact structure can be improved when the risk of leakage is reduced, thereby improving the carrier collection efficiency.

BRIEF DESCRIPTION OF THE DRAWINGS

To describe the technical solutions in embodiments of the present application more clearly, the accompanying drawings of the embodiments are briefly described below. It is obvious that the accompanying drawings in the following descriptions merely relate to some embodiments of the present application, but do not limit the present application.

DESCRIPTIONS OF REFERENCE NUMERALS

Figure 1:
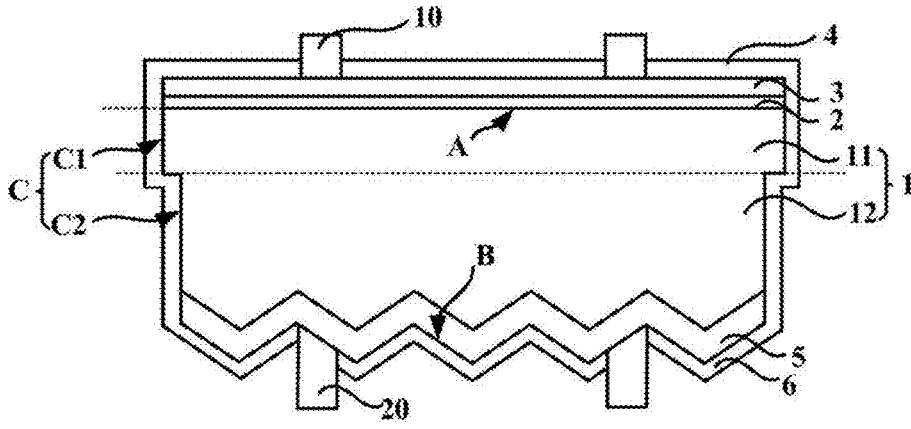
FIG. 1 is a schematic cross-sectional view of a solar cell according to an embodiment of the present application.

1—semiconductor substrate;
A—first surface;
B—second surface;
C—side surface;
C1—first region;
C2—second region;
C3—third region;
11—first semiconductor substrate portion;
12—second semiconductor substrate portion;
13—third semiconductor substrate portion;
d1—protrusion height of the first region;
d2—protrusion height of the third region;
2—interface passivation layer;
3—first doped semiconductor layer;
31—third doped semiconductor layer;
32—fourth doped semiconductor layer;
4—first passivation anti-reflection layer;
5—second doped semiconductor layer;
51—fifth doped semiconductor layer;
6—second passivation anti-reflection layer;
10—first electrode;
20—second electrode;
111—heavily doped semiconductor substrate layer;
100—minority-carrier region;
200—majority-carrier region;
300—isolation region;
16—first pyramid-base texture structure;
17—third texture structure; and
18—fourth texture structure.

DETAILED DESCRIPTION

To make objectives, technical solutions, and advantages of the present application clearer and more comprehensible, the present application is further described in detail below in combination with specific embodiments with reference to the accompanying drawings. However, the present application can be implemented in different forms and should not be explained as being limited to the embodiments provided herein. On the contrary, these embodiments are provided to make the present application clear and complete, and completely transfer the scope of the present application to a person skilled in the art. In the accompanying drawings, same reference numerals represent same elements.

The accompanying drawings show various schematic structural diagrams according to the embodiments of the present application. The figures are not drawn to scale. For an objective of clear expression, some details are enlarged, and some details may be omitted. Shapes of various regions and layers and relative sizes and position relationships between the regions and layers shown in the figures are merely exemplary. In practice, there may be a deviation due to a manufacturing tolerance or a technical limitation, and a person skilled in the art may additionally design regions/layers having different shapes, sizes and relative positions according to actual requirements.

In the context of the present application, when a layer/element is referred to as being "above" another layer/element, the layer/element may be directly above another layer/element, or a middle layer/element may exist between them. In addition, if a layer/element is "above" another layer/element in an orientation, the layer/element may be "below" another layer/element when the orientation is reversed. To make to-be-resolved technical problems, technical solutions, and beneficial effects of the present application clearer and more comprehensible, the present application is further described in detail below with reference to the accompanying drawings and the embodiments. It should be understood that the specific embodiments described herein are merely used for explaining the present application, but are not intended to limit the present application.

In addition, the terms "first", "second", and the like are merely intended for a purpose of description, and shall not be understood as indicating or implying relative significance or implicitly indicating a quantity of indicated technical features. Therefore, features defining "first" and "second" can explicitly or implicitly include one or more of the features. In the descriptions of the present application, unless clearly and specifically defined otherwise, "a plurality of" means two or more than two. Unless clearly and specifically defined otherwise, "several" means two or more than two.

In the descriptions of the present application, it should be noted that, unless otherwise clearly specified and defined, terms such as "mounting", "interconnection", and "connection" shall be understood in a broad sense, for example, may be a fixing connection, a detachable connection, an integral connection, a mechanical connection, an electrical connection, a direct connection, an indirect connection by using an intermediate medium, and communication between interiors of two components or interaction between two components. A person of ordinary skill in the art may understand specific meanings of the terms in the present application according to specific situations.

Terms used herein are merely intended to describe specific embodiments, but are not intended to limit the present application. The terms "include", "comprise", and the like used herein indicate existence of described features, steps, operations, and/or components, but do not exclude existence or addition of one or more other features, steps, operations, or components.

Figure 2:
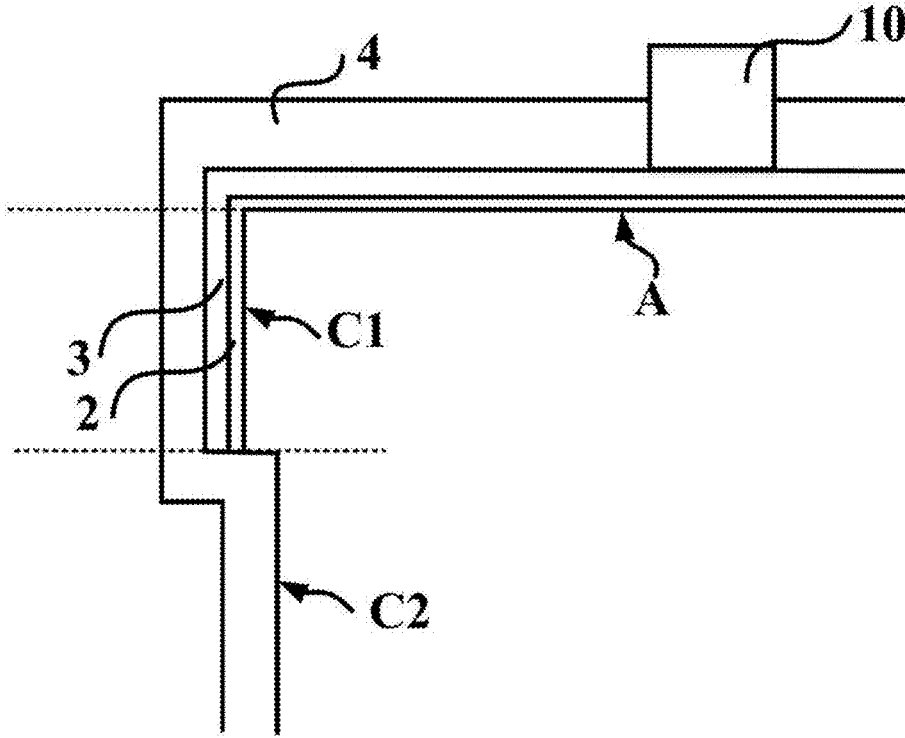
FIG. 2 is a schematic local cross-sectional view of a solar cell according to an embodiment of the present application.

As shown in FIG. 1 and FIG. 2, a solar cell includes: a semiconductor substrate 1. The semiconductor substrate 1 has a first surface A and a second surface B that are opposite to each other, and side surfaces C. The solar cell further includes a passivated contact structure, at least located on a part of the first surface A of the semiconductor substrate 1, where the passivated contact structure includes an interface passivation layer 2 and a first doped semiconductor layer 3 that are sequentially stacked. The solar cell further includes a first passivation anti-reflection layer 4. In a direction from the first surface A to the second surface B, respective side surface of the plurality of side surfaces C of the semiconductor substrate includes a first region C1 and a second region C2 that are adjacent. The first region C1 protrudes in a direction away from the respective side surface C relative to the second region C2.

Referring to FIG. 2, the first doped semiconductor layer 3 extends to the first region C1 from the first surface A of the semiconductor substrate 1 and covers the first region C1. A part of the first doped semiconductor layer 3 located in the first region C1 and another part of the first doped semiconductor layer 3 located on the first surface A are integrally continuous. This structure suppresses leakage to some extent. In addition, during preparation of an electrode, a case in which slurry configured to prepare the electrode is leaked and distributed in a larger range on the side surface of the solar cell, causing a severe damage to electrical performance of the solar cell, can also be effectively avoided. Moreover, protruding of the first region C1 can reduce a damage to performance of the solar cell that is caused when the solar cell is scratched.

Figures 3, 4:
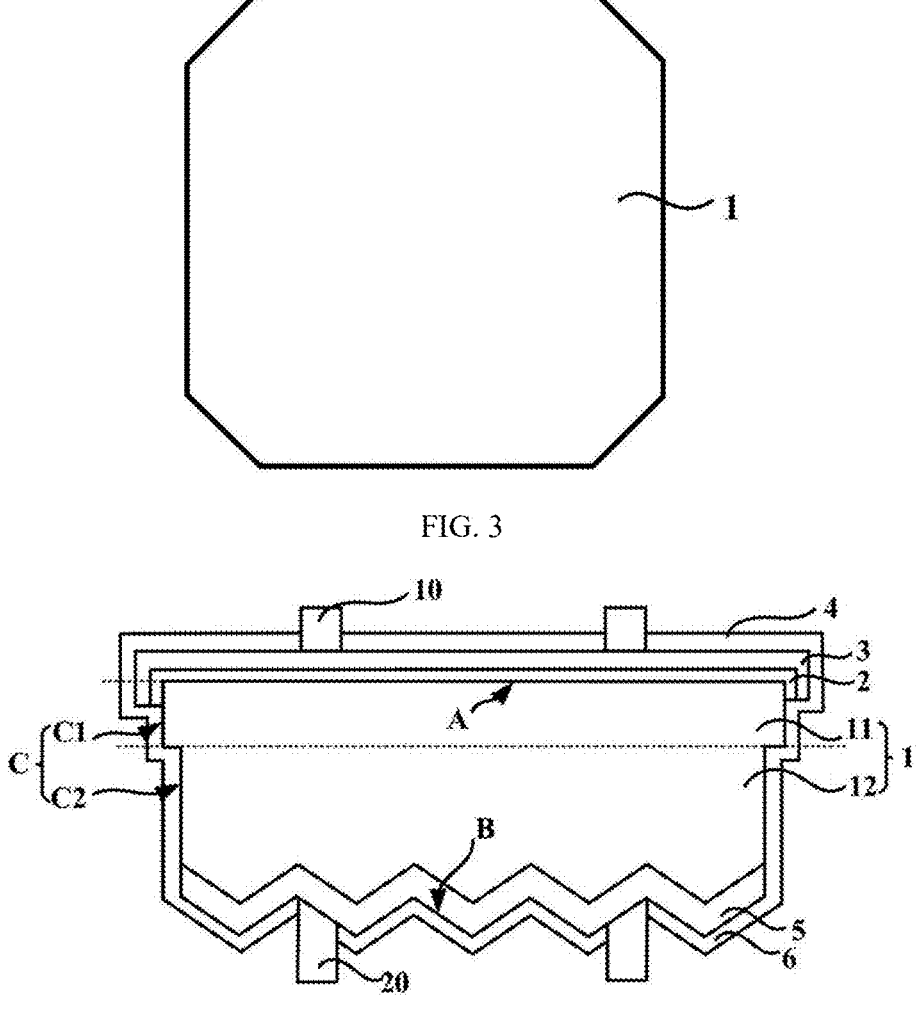
FIG. 3 is a schematic top view of a semiconductor substrate according to another embodiment of the present application.
FIG. 4 is a schematic cross-sectional view of a solar cell according to still another embodiment of the present application.

According to an example embodiment of the present application, referring to FIG. 3 and FIG. 4, another part of the surface of the first region C1 that is adjacent to the second region C2 is not covered by the first doped semiconductor layer 3.

In this embodiment, in the direction from the first surface A to the second surface B, the semiconductor substrate 1 includes a first semiconductor substrate portion 11 and a second semiconductor substrate portion 12 integrally formed with the first semiconductor substrate portion 11. The side surface C includes the first region C1 located on a side surface of the first semiconductor substrate portion 11 and the second region C2 located on a side surface of the second semiconductor substrate portion 12. A first region C1 of at least one of the side surfaces C protrudes in the direction away from the respective side surface C relative to a second region C2.

According to an embodiment of the present application, in a cross section parallel to the first surface A, an area of the first semiconductor substrate portion 11 is greater than an area of the second semiconductor substrate portion 12.

According to an embodiment of the present application, a height d1 for which the first region C1 protrudes relative to the second region C2 ranges from 0.5 μm to 5 μm, for example, may be 0.5 μm, 1 μm, 2 μm, or 5 μm, but is not limited to the listed values.

According to an embodiment of the present application, the semiconductor substrate 1 may be a silicon substrate. Alternatively, the semiconductor substrate 1 may be a substrate of any semiconductor material, such as a silicon-germanium substrate, a germanium substrate, or a gallium arsenide substrate. In addition, the semiconductor substrate 1 may be an N-type semiconductor substrate, or may be a P-type semiconductor substrate. The semiconductor substrate 1 may be monocrystal or polycrystal.

According to an embodiment of the present application, a shape of the semiconductor substrate 1 is a rectangle, and there is a chamfer between two adjacent sides of the rectangle. Referring to FIG. 3, the semiconductor substrate 1 includes, for example, eight side surfaces C.

According to an embodiment of the present application, the passivated contact structure extends, from the first surface A of the semiconductor substrate 1, to a part of a surface of a first region C1 of at least one of the side surfaces C. The passivated contact structure does not completely cover the first region C1, so that a risk of a short circuit brought by the passivated contact structure can be reduced. In addition, there is a step structure between the first region C1 and the second region C2, and there may be a doped region, serving as a substrate, on a side wall of the step structure, that is, a connection side wall between the first region C1 and the second region C2. The first doped semiconductor layer 3 easily contacts with the doped region on the side wall of the step structure, causing direct contact between the first doped semiconductor layer 3 and the semiconductor substrate 1, and resulting in a harmful short circuit of the solar cell. Therefore, the first doped semiconductor layer 3 is arranged far away from the side wall, to avoid the foregoing case.

According to an embodiment of the present application, in the direction from the first surface A to the second surface B, a distance between the first doped semiconductor layer 3 located on the surface of the first region C1 and the second region C2 is greater than or equal to 1 μm.

According to an embodiment of the present application, in a direction perpendicular to the first surface A, a distribution width of the first doped semiconductor layer 3 in the first region C1 is less than 80% of a width of the first region C1.

According to an embodiment of the present application, a ratio of a width of the first region C1 in a direction perpendicular to the first surface A to a thickness of the semiconductor substrate 1 ranges from 1% to 20%, for example, may be 1%, 5%, 10%, 15%, or 20%, but is not limited to the listed values. If a range of the ratio is excessively small, it is difficult to achieve technical effects of increasing an area of the passivated contact structure and improving carrier collection efficiency. If the range of the ratio is excessively large, leakage easily occurs between the first surface A and the second surface B.

According to an embodiment of the present application, a thickness of the first semiconductor substrate portion 11 in the direction perpendicular to the first surface A ranges from 0.5 μm to 20 μm, for example, may be 0.5 μm, 1 μm, 5 μm, 10 μm, or 20 μm, but is not limited to the listed values. The thickness of the first semiconductor substrate portion 11 in the direction perpendicular to the first surface A is a width of the first region C1 in the direction from the first surface A to the second surface B.

According to an embodiment of the present application, in a direction parallel to the first surface A, a first region C1 of at least one of the side surfaces C protrudes in the direction away from the respective side surface C1 relative to a second region C2, which is conducive to improving an effective area of the passivated contact structure on the first surface A, so that passivated contact performance of the first surface A and carrier collection efficiency are improved, thereby improving efficiency of the solar cell.

Because a doping concentration of a doped semiconductor layer is large, leakage of the solar cell usually occurs between doped semiconductor layers of different doping types. When the width of the first region C1 in the direction perpendicular to the first surface A is very large, leakage easily occurs between the first doped semiconductor layer 3 covering the first region C1 and a second doped semiconductor layer 5 located on the second surface B.

The width of the first region C1 is set to 1% to 20% of the thickness of the semiconductor substrate, and the first doped semiconductor layer 3 is located on a part of the surface of the first region C1, so that a risk of leakage between the first doped semiconductor layer 3 and the second surface B is reduced.

According to the solar cell provided in the foregoing embodiment of the present application, the first doped semiconductor layer is located on a part of the surface of the first region, so that the effective area of the passivated contact structure can be improved when the risk of leakage is reduced, and the carrier collection efficiency is improved.

According to an embodiment of the present application, the solar cell may be a double-surface solar cell, for example, a tunnel oxide passivated contact (Tunnel Oxide Passivated Contact, TOPCon) solar cell or a heterojunction solar cell (Heterojunction with Intrinsic Thin-layer, HIT).

According to an embodiment of the present application, the interface passivation layer 2 includes one of an intrinsic amorphous silicon layer, a low doping intrinsic amorphous silicon layer (whose doping concentration is lower than that of the first doped semiconductor layer), and a medium layer. The medium layer includes, but is not limited to, silicon oxide, aluminum oxide, doped aluminum oxide, silicon nitride, and silicon carbonitride. The first doped semiconductor layer 3 is at least one of a doped polysilicon layer, a doped microcrystalline silicon layer, a doped nanocrystalline silicon layer, and a doped amorphous silicon layer.

According to an embodiment of the present application, the interface passivation layer 2 is, for example, tunnel oxide silicon, and the first doped semiconductor layer 3 is, for example, doped polysilicon.

According to an embodiment of the present application, the interface passivation layer 2 is, for example, intrinsic amorphous silicon, and the first doped semiconductor layer 3 is, for example, doped amorphous silicon.

According to an embodiment of the present application, the TOPCon solar cell further includes: the second doped semiconductor layer 5, at least located on the second surface B of the semiconductor substrate 1, and serving as an emitter region (emitter) of the TOPCon solar cell. One of the second doped semiconductor layer 5 and the first doped semiconductor layer 3 is N-type doped, and the other of the second doped semiconductor layer 5 and the first doped semiconductor layer 3 is P-type doped.

According to an embodiment of the present application, the TOPCon solar cell further includes a second passivation anti-reflection layer 6, at least located on a surface that is of the second doped semiconductor layer 5 and that is away from the semiconductor substrate 1. The second passivation anti-reflection layer 6 is configured to implement passivation and anti-reflection functions of the second surface B of the semiconductor substrate 1.

Figure 5:
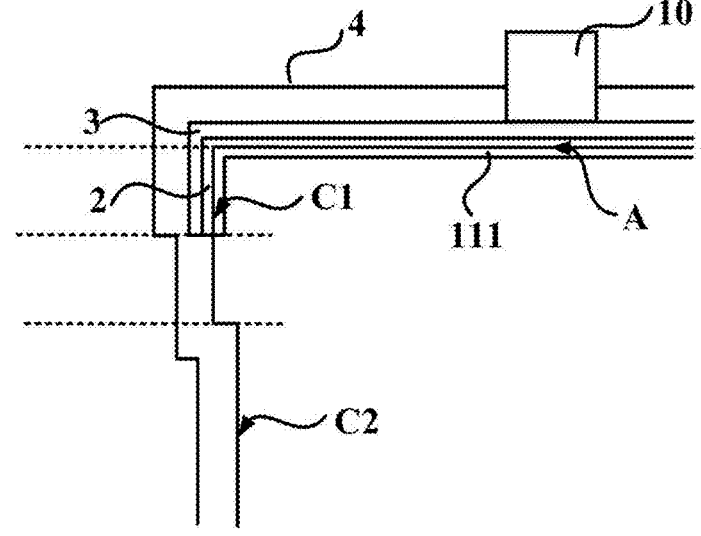
FIG. 5 is a schematic local cross-sectional view of a solar cell according to yet still another embodiment of the present application.

According to an embodiment of the present application, referring to FIG. 5, in an embodiment, a heavily doped semiconductor substrate layer 111 is formed on the first surface A of the semiconductor substrate 1 and the surface of the first region C1. The heavily doped semiconductor substrate layer 111 herein may be understood as that a doping concentration of the heavily doped semiconductor substrate layer 111 is greater than a doping concentration of the semiconductor substrate 1. Specifically, because doping elements need to be added in a process of forming the first doped semiconductor layer 3, a part of the doping elements diffuse into the semiconductor substrate 1, so that a concentration of the doping elements in a region that is of the semiconductor substrate 1 and that is close to the first surface A and the first region C1 is greater than the doping concentration of the semiconductor substrate 1. In an embodiment, the heavily doped semiconductor substrate layer 111 may be located on a part of the surface of the first region C1, or may be located on the entire surface of the first region C1.

Figure 6:
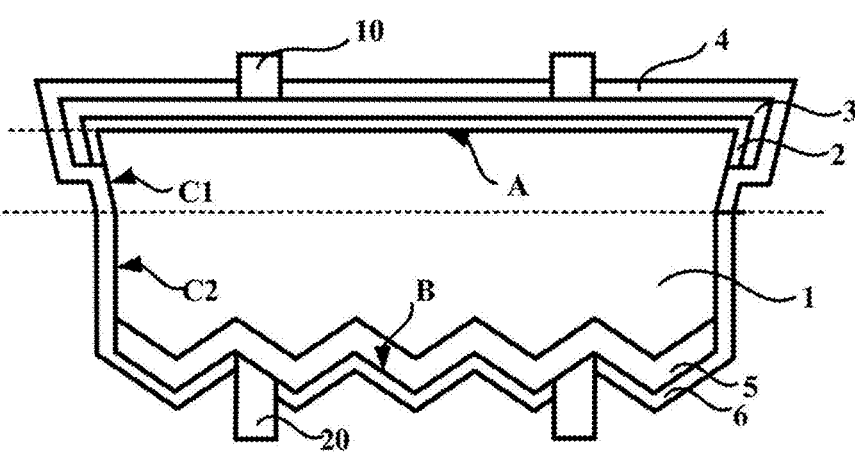
FIG. 6 is a schematic cross-sectional view of a solar cell according to yet still another embodiment of the present application.

In some embodiments, referring to FIG. 6, a first region C1 of at least one of the plurality of side surfaces C is an inclined surface extending, in the direction away from the side surface C, from a side away from the first surface A to a side close to the first surface A. In this way, a surface area of the first surface A can be increased, and the area of the passivated contact structure located on the first surface A can be increased, to help improve the carrier collection efficiency. In addition, a width of the entire side surface in the direction perpendicular to the first surface A can be increased, to better facilitate isolation between the first surface A and the second surface B.

According to an embodiment of the present application, the passivated contact structure extends, from the first surface A of the semiconductor substrate 1, to a part of the surface of the first region C1 of the at least one of the side surfaces C.

According to an embodiment of the present application, the interface passivation layer 2 and the first doped semiconductor layer 3 are further located on a part of the surface of the first region C1, so that a surface area of the passivated contact structure including the interface passivation layer 2 and the first doped semiconductor layer 3 can be increased, and the carrier collection efficiency can be improved, to improve the efficiency of the solar cell.

The first region C1 is an inclined surface and is flat, to help form, through deposition on the side surface C, the first passivation anti-reflection layer 4 with a better film quality, and improve passivation and anti-reflection effects of the first passivation anti-reflection layer 4.

Figure 7:
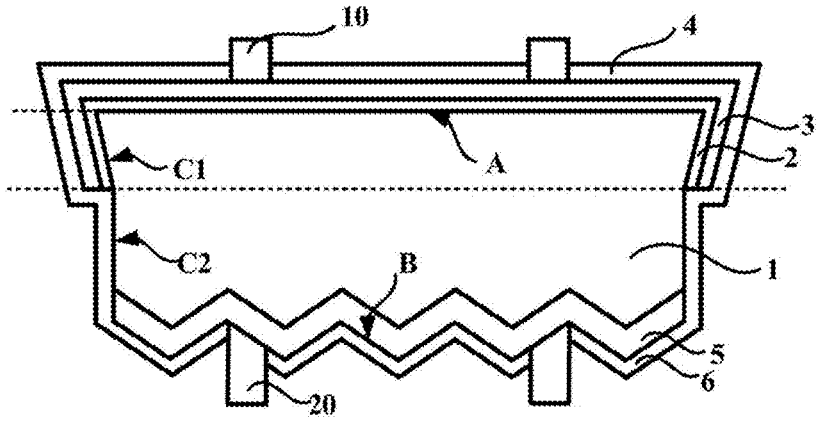
FIG. 7 is a schematic cross-sectional view of a solar cell according to yet still another embodiment of the present application.

In some embodiments, referring to FIG. 7, the first region C1 of the at least one of the plurality of side surfaces C is an inclined surface extending, in a direction away from the semiconductor substrate 1, from the side away from the first surface A to the side close to the first surface A, and there is no large step between the first region C1 and the second region C2, so that the passivation effect of the first passivation anti-reflection layer is improved. When a better passivation effect is considered, the first doped semiconductor layer 3 may alternatively be covered on most of the surface of the first region C1, or even covered on the entire first region C1.

Figure 8:
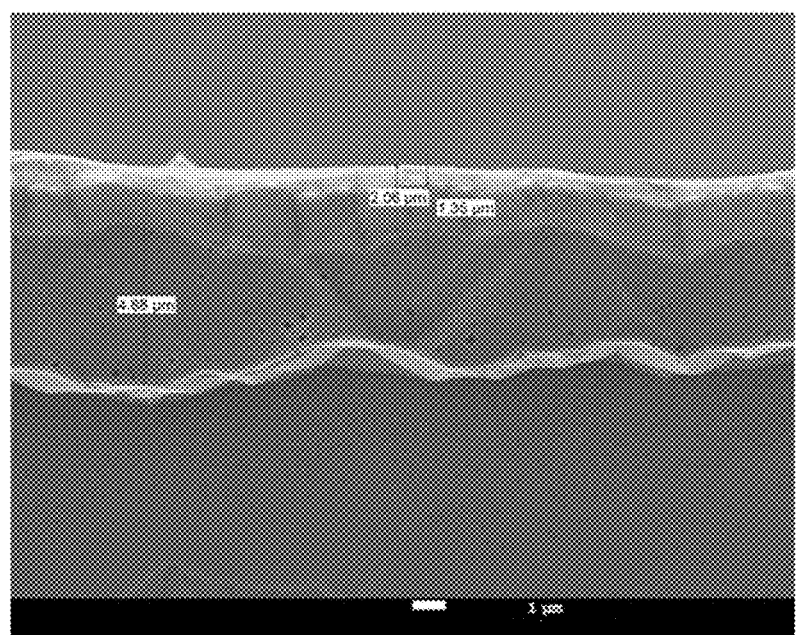
FIG. 8 is a scanning-electron-microscope (SEM) diagram of a side surface of a solar cell according to an embodiment of the present application.

FIG. 8 is a SEM diagram of a side surface of a solar cell according to an embodiment of the present application.

Referring to FIG. 8, in an embodiment, a plurality of holes are provided in the first region C1. The plurality of holes recess into the semiconductor substrate 1 in a direction parallel to the first surface A.

According to an embodiment of the present application, the passivated contact structure extends, from the first surface A of the semiconductor substrate 1, to a part of the surface of the first region C1 of the at least one of the side surfaces C. The holes recess into the semiconductor substrate 1 through the passivated contact structure in the direction parallel to the first surface A, and the first passivation anti-reflection layer 4 is located on the passivated contact structure in the first region C1 and both a side wall and a bottom surface of each of the holes, so that hydrogen in the first passivation anti-reflection layer 4 in the hole enters the semiconductor substrate 1. Therefore, a hydrogen passivation effect of the semiconductor substrate 1 is improved, to improve the efficiency of the solar cell. Generally, the first passivation anti-reflection layer 4 may include one or more layers of aluminum oxide, silicon nitride, and silicon oxynitride, for example, may be a laminated layer of aluminum oxide and silicon nitride. During deposition of aluminum oxide, a large amount of hydrogen is introduced. Due to a structure of the holes, the large amount of hydrogen can enter the semiconductor substrate 1.

In an embodiment, a distribution density of respective holes of the plurality of holes in a region close to the first surface A is less than a distribution density of respective holes of the plurality of holes in a region close to the second region C2. The distribution density of the respective holes of the plurality of holes in the region close to the first surface A is lower, so that recombination centers of carriers in the region close to the first surface A can be reduced, and recombination of the carriers is reduced, to improve the carrier collection efficiency.

In an embodiment, in the direction parallel to the first surface A, a radial size of the plurality of holes gradually decreases from the surface of the first region C1 to the semiconductor substrate 1. In other words, in the direction parallel to the first surface A, the holes are in a structure of an inverted pyramid extending from the surface of the first region C1 to the semiconductor substrate 1.

In an embodiment, the radial size of the plurality of holes is less than 5 µm, in an embodiment, less than 2 µm, and in an embodiment, less than 1 µm. The radial size of the plurality of holes may be, for example, 4 µm, 3 µm, 2 µm, or 1 µm, but is not limited to the listed values.

In an embodiment, a ratio of a projection area of the holes in the first region C1 to a surface area of the first region ranges from 1% to 30%, for example, may be 1%, 5%, 10%, 20%, or 30%, but is not limited to the listed values. If a range of the ratio is excessively small, it is difficult to achieve technical effects of improving a passivation effect of the semiconductor substrate and increasing the area of the passivated contact structure, or the effects are not obvious. If the range of the ratio is excessively large, defects of the semiconductor substrate 1 are excessive, which affects effective carrier collection.

According to an embodiment of the present application, a distribution density and a radial size of the structure of the holes in a region that is of the first region C1 and that is covered by the first doped semiconductor layer 3 or the passivated contact structure are both less than those in a region of the first region C1 that is not covered by the first doped semiconductor layer 3. In this way, a damage to the passivated contact structure can be reduced.

Figure 9:
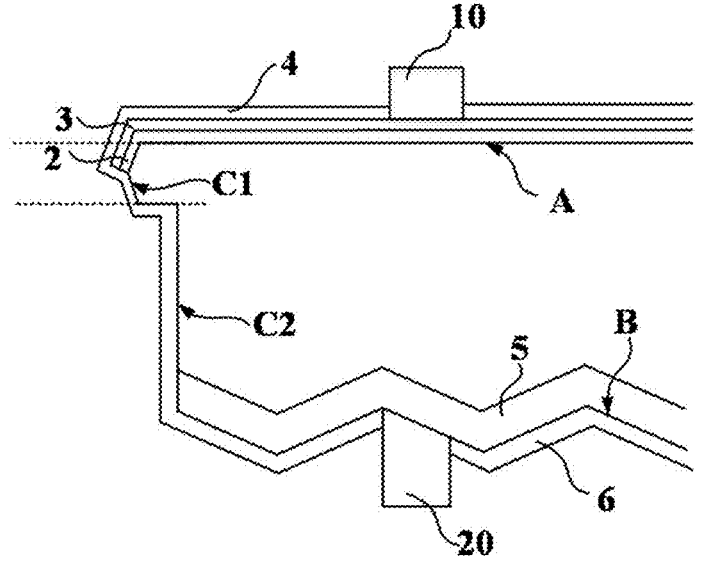
FIG. 9 is a schematic local cross-sectional view of a solar cell according to still another embodiment of the present application.

FIG. 9 is a schematic local cross-sectional view of a solar cell according to still another embodiment of the present application.

Figure 10:
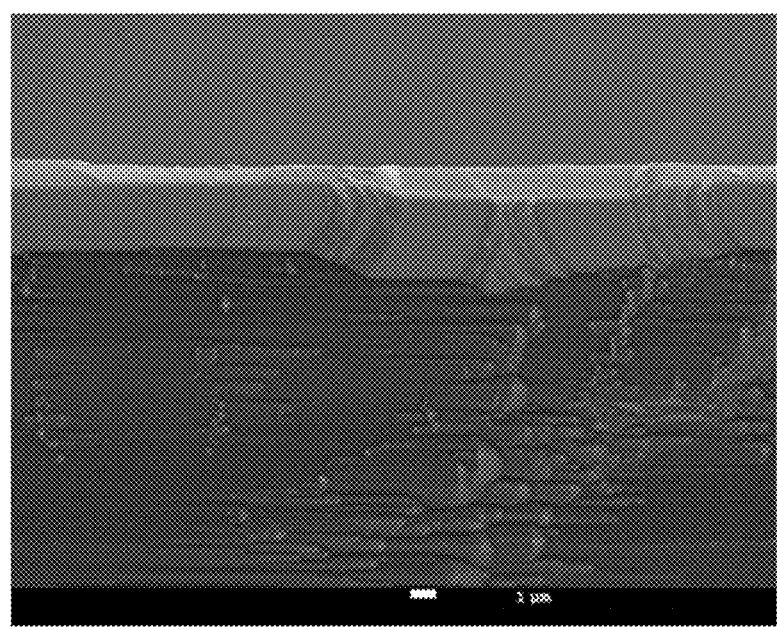
FIG. 10 is a SEM diagram of a side surface of the solar cell shown in FIG. 9.

FIG. 10 is a SEM diagram of a side surface of the solar cell shown in FIG. 9.

In some embodiments, referring to FIG. 9 and FIG. 10, the first region C1 includes a protruding edge, and the edge extends in a direction approximately parallel to the first surface A.

Referring to FIG. 9, the first doped semiconductor layer 3 is further located on a part of the surface of the first region C1. A part of the first doped semiconductor layer 3 located in the first region C1 and another part of the first doped semiconductor layer 3 located on the first surface A are integrally continuous. The part of the surface of the first region C1 that is adjacent to the second region C2 is not covered by the first doped semiconductor layer 3. The first region C1 includes the protruding edge, and the first doped semiconductor layer 3 is located on a part of the surface of the first region C1, so that electrical isolation between a front surface and a back surface of the solar cell can be enhanced. In addition, when leakage is controllable, a surface area of the first doped semiconductor layer 3 can be increased, to help improve the carrier collection efficiency.

Figure 11:
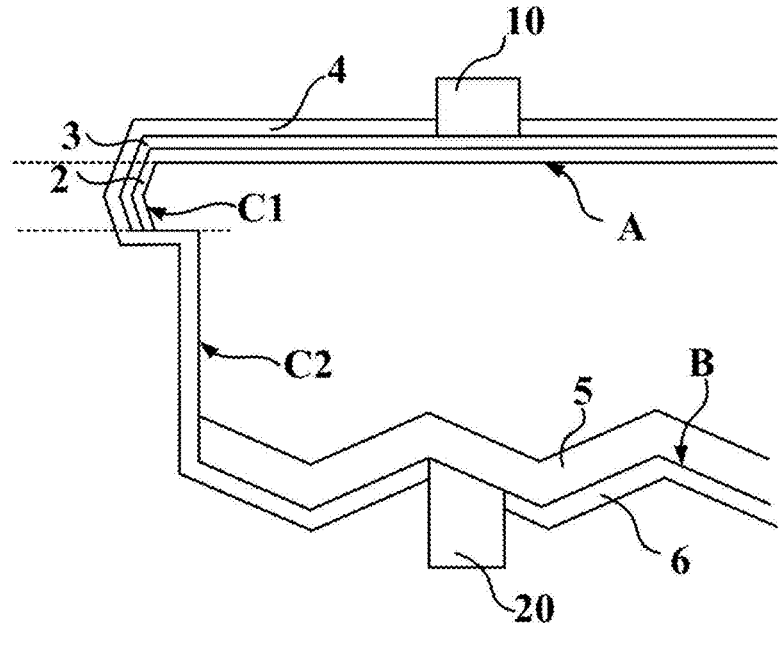
FIG. 11 is a schematic local cross-sectional view of a solar cell according to yet still another embodiment of the present application.

In some embodiments, referring to FIG. 11, the first region C1 includes the protruding edge, and the edge extends in the direction approximately parallel to the first surface A, so that the surface area of the first region C1 can be increased. When leakage is controllable, the first doped semiconductor layer 3 covers the entire first region C1, so that the surface area of the first doped semiconductor layer 3 can be increased, thereby facilitating improving the carrier collection efficiency.

The first region C1 of at least one of the side surfaces C includes the protruding edge, and the edge extends in the direction approximately parallel to the first surface A. In other words, a part that is of the first region C1 and that is close to the second region C2 is an inclined surface extending, in a direction away from the semiconductor substrate 1, from a side of the second region C2 to a side of the edge.

There is no large step, or even no step, between the first region C1 and the second region C2. This helps improve the passivation effect of the passivation anti-reflection layer. When the passivation effect is considered, the first doped semiconductor layer may alternatively be covered on most of the surface of the first region C1, or even covered on the entire first region C1. According to an embodiment of the present application, the second region C2 has a pyramid-base structure, and the width of the first region C1 in the direction perpendicular to the first surface A is less than a size of the pyramid-base structure of the second region C2. The size of the pyramid-base structure is defined as a side length or a diagonal length of the pyramid-base structure.

In some embodiments, the solar cell further includes a first electrode 10. The first electrode 10 penetrates the first passivation anti-reflection layer 4 to be in electrical contact with the first doped semiconductor layer 3. The solar cell further includes a second electrode 20. The second electrode 20 penetrates the second passivation anti-reflection layer 6 to be in electrical contact with the second doped semiconductor layer 5.

In an embodiment, a distance between the first electrode 10 and the first region C1 in a direction perpendicular to a thickness direction of the semiconductor substrate 1 (in the direction parallel to the first surface A) is greater than or equal to 300 µm. Therefore, during preparation of an electrode, a case in which slurry configured to prepare the electrode is leaked and distributed in a larger range on the side surface of the solar cell, causing a severe damage to electrical performance of the solar cell, can also be effectively avoided.

In an embodiment, the first doped semiconductor layer 3 is one or more of doped polysilicon, doped amorphous silicon, and doped microcrystalline silicon. For example, the first doped semiconductor layer 3 is doped polysilicon. A thickness of the doped polysilicon usually ranges from 80 nm to 500 nm, and a doping concentration usually ranges from 1*1017 atoms/cm3 to 1*1021 atoms/cm3. In some embodiments, referring to FIG. 12, respective side surface of the plurality of side surfaces C further includes a third region C3 adjacent to the second region C2. The third region C3 is closer to the second surface B than the second region C2. In other words, the solar cell further includes a third semiconductor substrate portion 13, integrally formed with the second semiconductor substrate portion 12. In addition, the third semiconductor substrate portion 13 is closer to the second surface B than the second semiconductor substrate portion 12.

According to an embodiment of the present application, the third region C3 protrudes in the direction away from the side surface C relative to the second region C2. In an embodiment, a protrusion height d2 of the third region C3 is greater than the protrusion height d1 of the first region C1.

In some embodiments, the protrusion height d2 of the third region C3 ranges from 3 µm to 10 µm, for example, may be 3 µm, 5 µm, 6 µm, 8 µm, or 10 µm, but is not limited to the listed values.

In some embodiments, when the second doped semiconductor layer 5 is formed on the second surface B, the second doped semiconductor layer 5 is wrapped around the side surface C. When the second doped semiconductor layer 5 wrapped around the side surface C is removed by using alkaline solution, the third region C3 is formed in a region that is of the side surface C and that is close to the second surface B. The third region C3 protrudes in the direction away from the side surface C relative to the second region C2. Therefore, on one hand, a space electrical isolation distance between the first surface A and the second surface B can be increased, to better prevent leakage on the side surface of the solar cell. On the other hand, slurry configured to prepare the electrode on the second surface B can be effectively prevented from being leaked to the side surface, so that a damage to the performance of the solar cell can be avoided.

In addition, the third region C3 protrudes in the direction away from the side surface C relative to the second region C2, so that a junction area of a PN junction including the semiconductor substrate 1 and the second doped semiconductor layer 5 can be increased, to help improve a photogenerated current of the solar cell.

Figure 13:
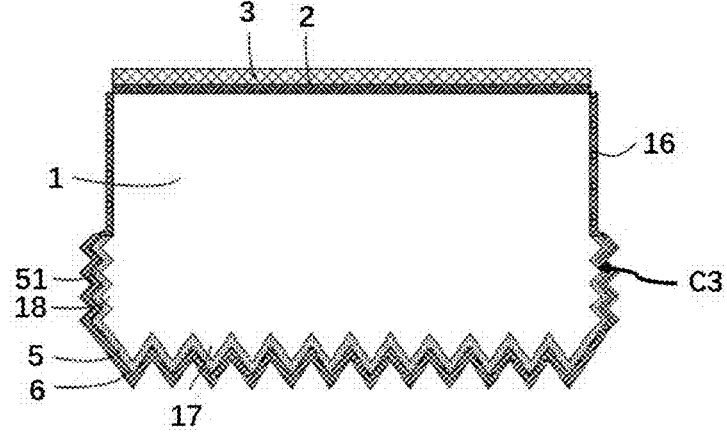
FIG. 13 is a schematic longitudinal-section view of a solar cell according to an embodiment of the present application.

For wrap-around of the second doped semiconductor layer 5 on the side surface C, the present application provides another implementation. As shown in FIG. 13, the second doped semiconductor layer 5 is wrapped around the side surface C as a fifth doped semiconductor layer 51. The fifth doped semiconductor layer 51 is formed on a local region of the side surface of the semiconductor substrate 1, and is integrally continuous with the second doped semiconductor layer 5. A conductive type of the fifth doped semiconductor layer 51 is the same as that of the second doped semiconductor layer 5, and a ratio of a maximum extension length of the fifth doped semiconductor layer 51 in the thickness direction of the semiconductor substrate 1 to the thickness of the semiconductor substrate 1 is greater than 5% and less than or equal to 50%. A first pyramid-base texture structure 16 is formed on a surface of a region that is in the side surface of the semiconductor substrate 1 and that does not correspond to the fifth doped semiconductor layer 51. A side length of at least a part of the first pyramid-base texture structure 16 is greater than or equal to 10 µm. The first doped semiconductor layer 3 is formed on a side of the first surface of the semiconductor substrate 1.

A conductive type of the first doped semiconductor layer 3 is opposite to that of the second doped semiconductor layer 5.

Figure 14:
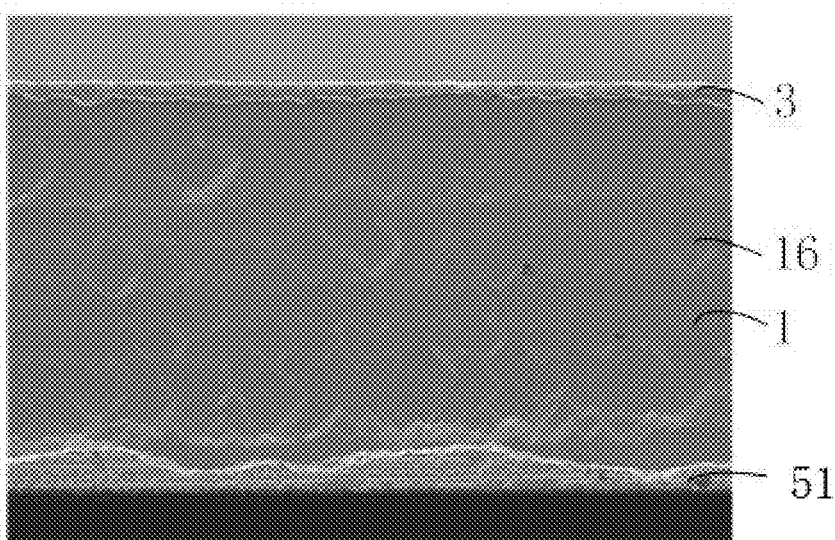
FIG. 14 is a first SEM diagram of a side surface of a solar cell according to an embodiment of the present application.
Figure 15:
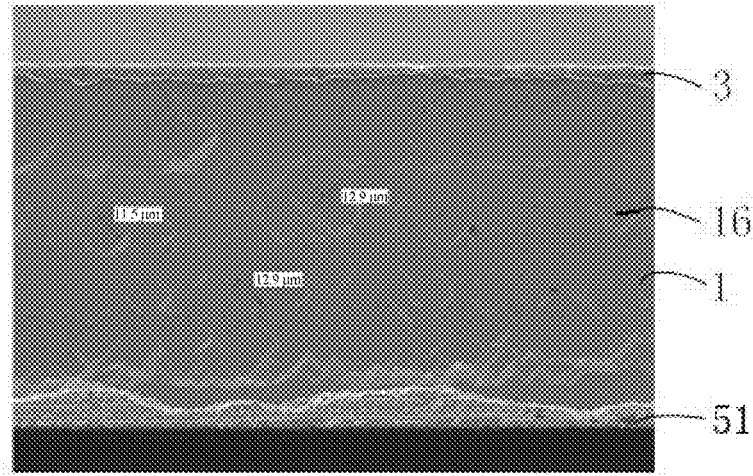
FIG. 15 is a second SEM diagram of a side surface of a solar cell according to an embodiment of the present application.

When the foregoing technical solution is used, as shown in FIG. 13, the solar cell provided in this embodiment of this application includes the second doped semiconductor layer 5 and the first doped semiconductor layer 3 that have opposite conductive types and that are located on the second surface and the first surface opposite to each other in the semiconductor substrate 1. One of the second doped semiconductor layer 5 and the first doped semiconductor layer 3 may form a PN junction with the semiconductor substrate 1, and the other may form a high-low junction with the semiconductor substrate 1. Under joint action of built-in electric fields of the PN junction and the high-low junction, carriers of opposite conductive types are split, and carriers of corresponding conductive types are respectively enabled to move toward the second doped semiconductor layer 5 and the first doped semiconductor layer 3 and are collected by the second doped semiconductor layer 5 and the first doped semiconductor layer 3. In an actual manufacturing process, when the second doped semiconductor layer 5 is manufactured on a side of the second surface of the semiconductor substrate 1, the fifth doped semiconductor layer 51 is formed, through wrap-around, on the side surface of the semiconductor substrate 1 and a side of at least a part of the first surface. Because the conductive type of the fifth doped semiconductor layer 51 is opposite to that of the first doped semiconductor layer 3, before the first doped semiconductor layer 3 is formed, a part that is of the fifth doped semiconductor layer 51 and that is located on the first surface and a region of the side surface close to the first surface further needs to be removed, to avoid a short circuit between the second doped semiconductor layer 5 and the first doped semiconductor layer 3 that is caused by the fifth doped semiconductor layer 51. In the foregoing case, as shown in FIG. 13 to FIG. 15, in the solar cell provided in this embodiment of the present application, only the part that is of the fifth doped semiconductor layer 51 and that is located on the first surface and the region of the side surface close to the first surface needs to be removed. Therefore, a short circuit can be avoided, and a problem of over etching occurring in the second doped semiconductor layer 5 on the side of the second surface when all of a part of the fifth doped semiconductor layer 51 formed on the side surface is removed in the related art can be resolved, to ensure a large forming range of the second doped semiconductor layer 5 on the side of the second surface, and ensure that an edge region of the second surface can be covered. In addition, existence of the fifth doped semiconductor layer 51 reserved in the local region of the side surface helps increase an area of a junction (the PN junction or the high-low junction) close to the side of the second surface. Secondly, in this embodiment of the present application, the fifth doped semiconductor layer 51 located in the local region of the side surface is reserved, to help improve an etching production capacity, and reduce consumption of cleaning fluid and etching costs.

In an embodiment, as shown in FIG. 13 to FIG. 15, the first pyramid-base texture structure 16 is formed on the surface of the region that is in the side surface of the semiconductor substrate 1 and that does not correspond to the fifth doped semiconductor layer 51. It may be understood that a side that is of the first pyramid-base texture structure 16 and that is close to the semiconductor substrate 1 is quadrangular. Based on this, the first pyramid-base texture structure 16 is approximately a pyramid-base structure that is re-formed, after a pyramid structure is removed, by corroding a part that is of the exposed side surface of the semiconductor substrate 1 and that is close to the first surface by using corrosion solution in different directions, different corrosion manners, and at different corrosion rates. Based on this, in comparison with a complete pyramid structure, a surface of the first pyramid-base texture structure 16 is flat. In indicates that, after the fifth doped semiconductor layer 51 in the part that is of the side surface and that is close to the first surface is removed and a wrap-around doped silicon layer wrapped around on at least a part of the side surface when the first doped semiconductor layer 3 is formed is removed, the fifth doped semiconductor layer 51 and the wrap-around doped silicon layer do not remain in at least the part that is of the side surface and that is close to the first surface, to avoid a short circuit. Secondly, it can be understood that, different maximum extension lengths of the fifth doped semiconductor layer 51 along the thickness direction of the semiconductor substrate 1 leads to different requirements on leakage suppression between the fifth doped semiconductor layer 51 and the first doped semiconductor layer 3. Specifically, within a particular range, a larger maximum extension length of the fifth doped semiconductor layer 51 along the thickness direction of the semiconductor substrate 1 indicates a smaller distance between the fifth doped semiconductor layer 51 and the first doped semiconductor layer 3, and correspondingly, a higher requirement of anti-leakage between the fifth doped semiconductor layer 51 and the first doped semiconductor layer 3. In addition, a larger side length of the first pyramid-base texture structure 16 indicates a higher degree of etching by the corrosion solution on the part that is of the side surface of the semiconductor substrate 1 and that does not correspond to the fifth doped semiconductor layer 51. Based on this, when the ratio of the maximum extension length of the reserved fifth doped semiconductor layer 51 in the thickness direction of the semiconductor substrate 1 to the thickness of the semiconductor substrate 1 is greater than 5% and less than or equal to 50%, and when the side length of at least the part of the first pyramid-base texture structure 16 is greater than or equal to 10 μm, it can be ensured that the fifth doped semiconductor layer 51 and the first doped semiconductor layer 3 can be isolated by using an isolation region between the fifth doped semiconductor layer 51 and the first doped semiconductor layer 3, and a risk of leakage between the fifth doped semiconductor layer 51 and the first doped semiconductor layer 3 is reduced, to help improve operation performance of the solar cell.

In an embodiment, the second surface of the semiconductor substrate may correspond to a light-facing surface of the solar cell. In this case, the first surface of the semiconductor substrate corresponds to a back surface of the solar cell.

For example, as shown in FIG. 13, a third texture structure 17 is formed on the second surface, and a fourth texture structure 18 is formed on a surface of a region that is in the side surface of the semiconductor substrate 1 and that corresponds to the fifth doped semiconductor layer 51. In the foregoing case, a morphology of the fourth texture structure 18 is the same as or different from that of the third texture structure 17. For example, the third texture structure and/or the fourth texture structure may be a suede structure such as a pyramid structure, or may be a non-pyramid structure (e.g., a hole structure, a V-shaped groove structure, or a pyramid-base structure) or a polished structure.

In an embodiment, as shown in FIG. 13, a one-dimensional size of the fourth texture structure 18 may be smaller than that of the third texture structure 17. Alternatively, a one-dimensional size of the fourth texture structure 18 may be equal to or larger than that of the third texture structure 17.

In an embodiment, as shown in FIG. 13, the one-dimensional size of the fourth texture structure 18 is smaller than that of the third texture structure 17, and the third texture structure 17 having the larger one-dimensional size is formed on the second surface of the semiconductor substrate 1, to help increase a specific surface area of the second surface, and ensure a good light trapping effect on the side of the second surface, so that more light is refracted into the semiconductor substrate 1 through the side of the second surface and is used by the semiconductor substrate 1, thereby improving photoelectric conversion efficiency of the solar cell. Secondly, the fourth texture structure 18 having the smaller one-dimensional size is formed on the surface of the region that is in the side surface of the semiconductor substrate 1 and that corresponds to the fifth doped semiconductor layer 51, to help reduce a difference in a flatness degree of the surface of the region that is in the side surface of the semiconductor substrate 1 and that corresponds to the fifth doped semiconductor layer 51, and reduce a quantity of recombination centers.

As shown in FIG. 14 and FIG. 15, in an embodiment, the side that is of the first pyramid-base texture structure 16 and that is close to the semiconductor substrate 1 is quadrangular. Based on this, the side length of the first pyramid-base texture structure 16 is a length of any side of a bottom (the side close to the semiconductor substrate 1) of the first pyramid-base texture structure 16.

In an embodiment, the side length of at least the part of the first pyramid-base texture structure is less than or equal to 15 μm. For example, the side length of at least the part of the first pyramid-base texture structure may be 10 μm, 11 μm, 12 μm, 13 μm, 14 μm, or 15 μm. In this case, when a risk of leakage between the second doped semiconductor layer 5 and the first doped semiconductor layer 3 that is caused by the fifth doped semiconductor layer 51 is reduced, over etching by the corrosion solution on the exposed part that is of the side surface of the semiconductor substrate and that does not correspond to the fifth doped semiconductor layer 51 is avoided, to ensure low consumption of the semiconductor substrate, thereby ensuring that the semiconductor substrate sufficiently extracts light refracted to the semiconductor substrate, and has a large light absorbing cross-sectional area, so that utilization of the solar cell for light is improved. In addition, when the solar cell further includes the first or second passivation anti-reflection layer, when the side length of at least the part of the first pyramid-base texture structure is less than or equal to 15 μm, a case in which a thickness of the first or second passivation anti-reflection layer formed on the surface is small because the side length of the first pyramid-base texture structure is excessively large is avoided, to ensure that the first or second passivation anti-reflection layer has a good passivation effect on the surface that is in the side surface of the semiconductor substrate and that does not correspond to the fifth doped semiconductor layer, reduce a quantity of defects on the surface, and further reduce a carrier recombination rate.

In some implementations, as shown in FIG. 13, if the fifth doped semiconductor layer 51 is formed in the local region of the side surface of the semiconductor substrate 1, but the first doped semiconductor layer 3 is not formed on the side surface of the semiconductor substrate 1, the first pyramid-base texture structure 16 is formed on the surface of the region that is in the side surface of the semiconductor substrate 1 and that does not correspond to the fifth doped semiconductor layer. Side lengths of first pyramid-base texture structures 16 formed on different parts of the surface of the region that is in the side surface of the semiconductor substrate 1 and that does not correspond to the fifth doped semiconductor layer 51 may be approximately the same.

Figure 12:
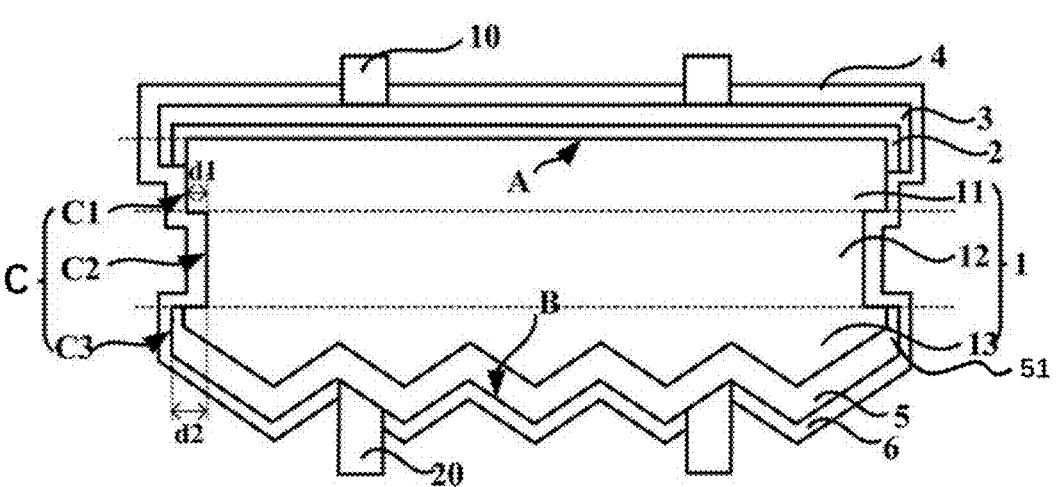
FIG. 12 is a schematic cross-sectional view of a solar cell according to yet another embodiment of the present application.

In an embodiment, as shown in FIG. 12, the first pyramid-base texture structure is formed in the second region C2 on the side surface C of the semiconductor substrate 1. A second pyramid-base texture structure is formed in the first region C1 on the side surface C of the semiconductor substrate 1 and/or the first surface, and the side length of at least the part of the first pyramid-base texture structure is greater than a side length of the second pyramid-base texture structure. In this case, it is beneficial to increase an area of a junction (the PN junction or the high-low junction) on a side close to the first surface, and increase a strength of a built-in electric field on the side close to the first surface, and it is further beneficial to accelerate splitting of carriers and increase a rate of transmitting the carriers to the second doped semiconductor layer 5 and the first doped semiconductor layer 3, so that the carrier collection efficiency is improved. In addition, in this case, on the side surface of the semiconductor substrate 1, the side length of at least the part of the first pyramid-base texture structure formed in the second region C2 is greater than the side length of the second pyramid-base texture structure formed in the first region C1 and/or on the first surface. This manner can reduce a risk of a short circuit between the fifth doped semiconductor layer 51 on the side surface of the semiconductor substrate 1 and the first doped semiconductor layer on the side surface.

In an embodiment, the side length of the first pyramid-base texture structure is greater than or equal to 10.5 µm. In this case, when the side length of the first pyramid-base texture structure is within the foregoing range, a case in which degrees for which a risk of leakage is reduced are low because a distance between the first doped semiconductor layer 3 and the fifth doped semiconductor layer 51 in the thickness direction of the semiconductor substrate is small due to a small side length of the first pyramid-base texture structure, can be avoided, to ensure that the side surface of the semiconductor substrate has a low carrier recombination rate.

Figure 16:
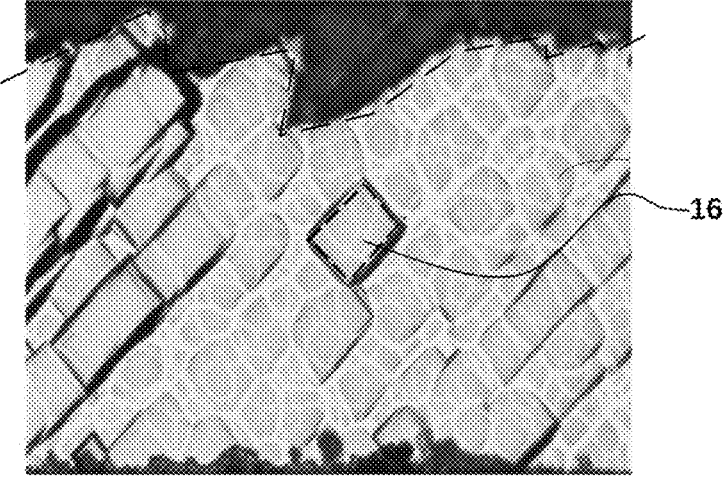
FIG. 16 is a 3D diagram of a side surface of a solar cell according to an embodiment of the present application.

In an embodiment, as shown in FIG. 16, a plurality of first texture structure groups extending along a third direction and arranged along a fourth direction are formed in the second region C2 on the side surface of the semiconductor substrate. Each of the first texture structure groups includes a plurality of first pyramid-base texture structures 16 arranged along the third direction. The third direction is different from the fourth direction, and the third direction is obliquely arranged relative to the second surface. In this case, different first pyramid-base texture structures 16 are arranged regularly, to help improve a flatness degree of the surface of the second region C2 on the side surface, and help increase a forming thickness of the first or second passivation anti-reflection layer above the side surface, thereby improving a passivation effect of the first or second passivation anti-reflection layer on the side surface. The third direction and the fourth direction may be any two different directions parallel to the side surface, provided that the third direction is obliquely arranged relative to the second surface. Specifically, in an actual manufacturing process, an extension direction (that is, the third direction) of the first texture structure groups is approximately parallel to a direction in which the semiconductor substrate is cut, and cutting is performed along a direction obliquely arranged relative to the thickness direction of the semiconductor substrate, to help reduce cutting resistance and reduce difficulty in cutting the semiconductor substrate.

In an embodiment, the second pyramid-base texture structure is formed on the first surface and/or in the first region C1, and a morphology of the at least one second pyramid-base texture structure may be the same as or different from that of the first pyramid-base texture structure. In an embodiment, the side length of the at least one first pyramid-base texture structure may be greater than the side length of the second pyramid-base texture structure. The side length of the first pyramid-base texture structure is greater than the side length of the second pyramid-base texture structure formed on the first surface or in the first region C1, to help avoid a short circuit.

In an embodiment, at least a part of the second pyramid-base texture structure recesses along a direction close to the semiconductor substrate 1, and a side that is of at least the part of the second pyramid-base texture structure and that is close to the semiconductor substrate 1 is quadrangular.

In an embodiment, the side length of the second pyramid-base texture structure may be greater than or equal to 5 µm and less than or equal to 13 µm. For example, the side length of the second pyramid-base texture structure may be 5 µm, 6 µm, 8 µm, 8.5 µm, 9 µm, 9.5 µm, 10 µm, 10.5 µm, 11 µm, or 13 µm. When the side length of the second pyramid-base texture structure is within the foregoing range, a case in which a pyramid structure on the side of the first surface of the semiconductor substrate is not completely removed because duration for which the corrosion solution corrodes the side of the first surface is short due to a small side length of the second pyramid-base texture structure, can be avoided. In addition, over etching on the side of the first surface of the semiconductor substrate that is caused when a specific surface area of the side of the first surface is large due to a large side length of the second pyramid-base texture structure is further avoided, to ensure that the semiconductor substrate has a large light absorption depth, and ensure that the solar cell has high photoelectric conversion efficiency.

In an embodiment, an end that is of the fifth doped semiconductor layer and that is close to the first surface has a feature of unevenness. When a boundary between the region corresponding to the fifth doped semiconductor layer and the region not corresponding to the fifth doped semiconductor layer is in a curved shape such as a zigzag shape or a wave shape, a surface area of a side wall of the boundary is further increased, to help absorb light. In addition, when the side wall of the boundary is in the wave shape, multiple reflection of light can be increased.

In an embodiment, when the side surface further includes the first doped semiconductor layer 3, on the side surface of the semiconductor substrate, a boundary between a region corresponding to the first doped semiconductor layer 3 and a region not corresponding to the first doped semiconductor layer 3 is a flat straight line. Alternatively, on the side surface of the semiconductor substrate, a boundary between a region corresponding to the first doped semiconductor layer 3 and a region not corresponding to the first doped semiconductor layer 3 is in a curved shape such as a zigzag shape or a wave shape.

Figure 17:
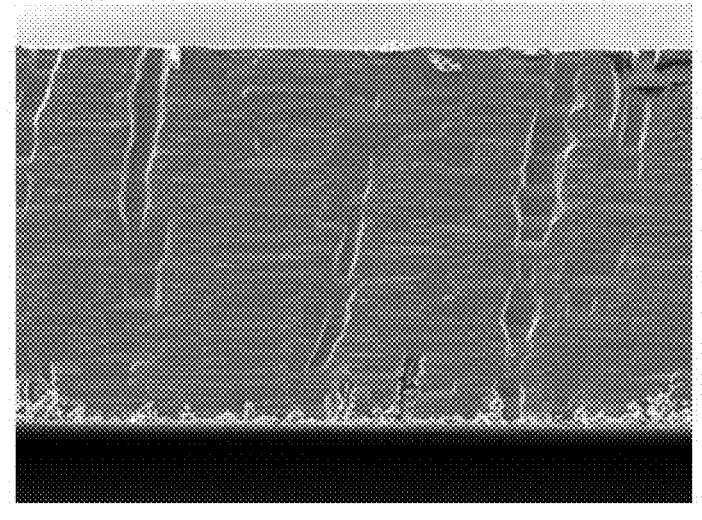
FIG. 17 is a first SEM diagram of a chamfered surface of a solar cell according to an embodiment of the present application.
Figure 18:
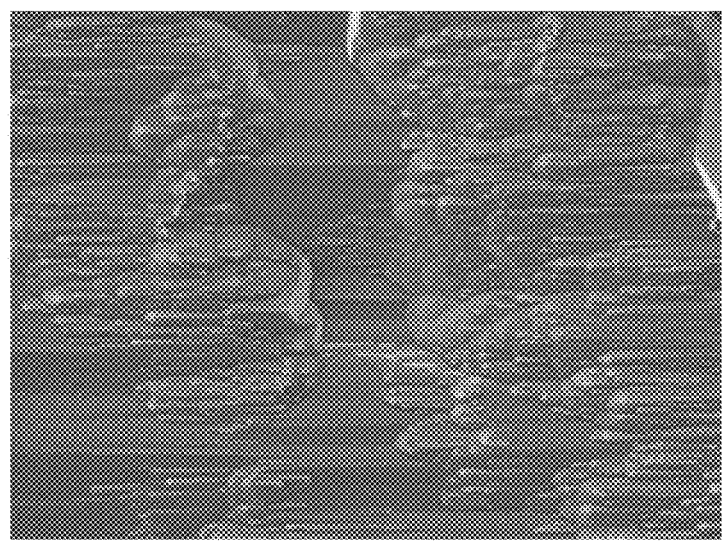
FIG. 18 is a second SEM diagram of a chamfered surface of a solar cell according to an embodiment of the present application.
Figure 19:
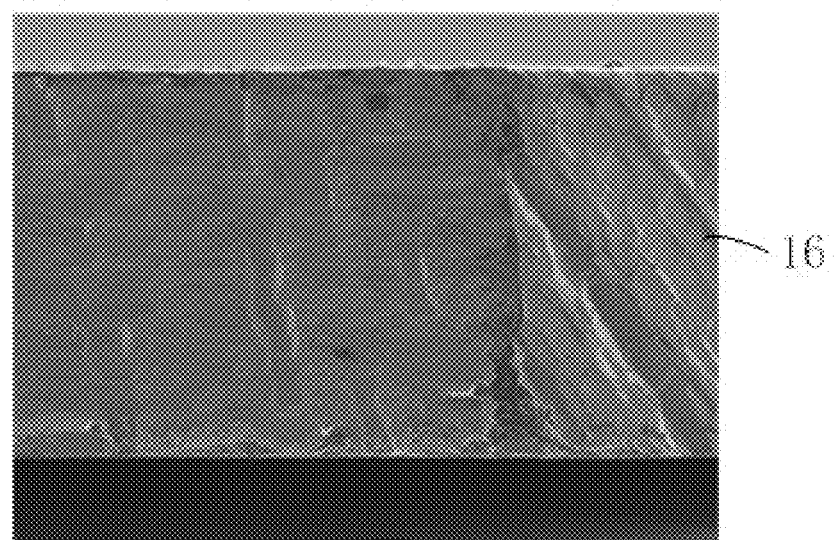
FIG. 19 is a third SEM diagram of a chamfered surface of a solar cell according to an embodiment of the present application.

In an embodiment, the semiconductor substrate further includes a chamfered surface connecting the second surface and the first surface. The chamfered surface is a plane on which no texture structure is formed. Alternatively, as shown in FIG. 17 to FIG. 19, a plurality of second texture structure groups extending along a fifth direction and distributed at intervals along a sixth direction is formed on the chamfered surface. The fifth direction is different from the sixth direction, and the fifth direction is approximately parallel to the thickness direction of the semiconductor substrate 1. In addition, each of the second texture structure groups includes a plurality of cluster-shape texture structures extending along the sixth direction and arranged along the fifth direction. On the chamfered surface, a surface of a region between two adjacent second texture structure groups is in a shape of a corrugated polyline arranged along the fifth direction. In this case, when the cluster-shape texture structures arranged according to a particular rule are formed on the chamfered surface of the semiconductor substrate 1, and a surface of a region between two adjacent second texture structure groups including different cluster-shape texture structures is in a shape of a corrugated polyline arranged along the fifth direction, the chamfered surface has a corrugated surface morphology, to help increase a specific surface area of the chamfered surface and help enable the chamfered surface to have a good light trapping effect, so that utilization of the semiconductor substrate 1 for light is further improved.

In this embodiment of the present application, a size and distribution of the cluster-shape texture structures, specific directions of the fifth direction and the sixth direction, and a fluctuation degree for which the surface of the region between the two adjacent second texture structure groups on the chamfered surface is in the shape of a corrugated polyline are not specifically limited. For example, the fifth direction is approximately parallel to the thickness direction of the semiconductor substrate, and the sixth direction is parallel to an edge of the chamfered surface along the thickness direction of the semiconductor substrate.

In some implementations, the solar cell is a solar cell having a single-surface electrode, for example, an interdigitated back contact (Interdigitated Back Contact, IBC) solar cell.

Figure 20:
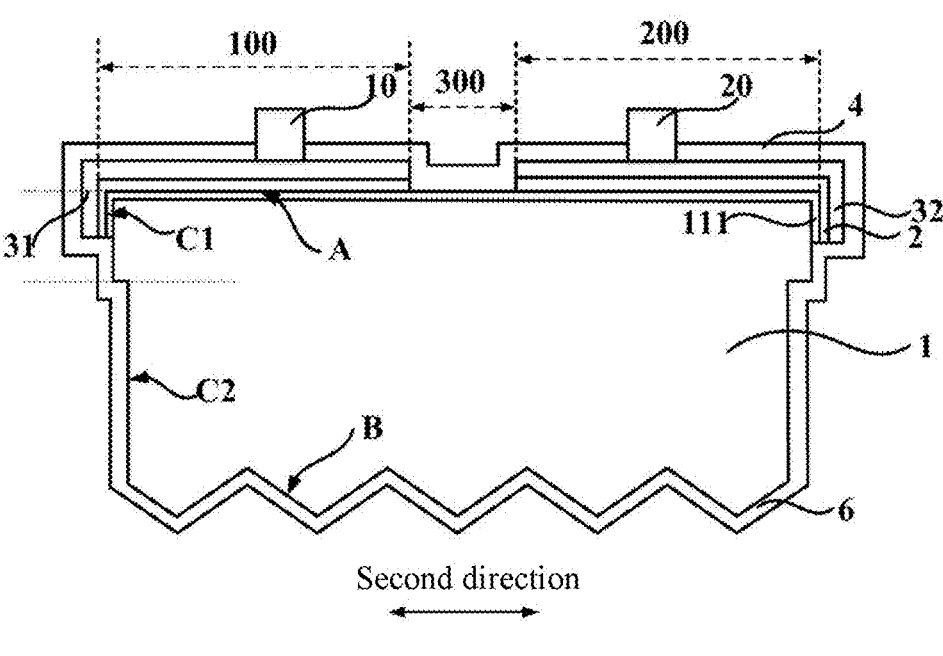
FIG. 20 is a schematic cross-sectional view of a back contact solar cell according to an embodiment of the present application.

FIG. 20 is a schematic cross-sectional view of a back contact solar cell according to an embodiment of the present application.

Figure 21:
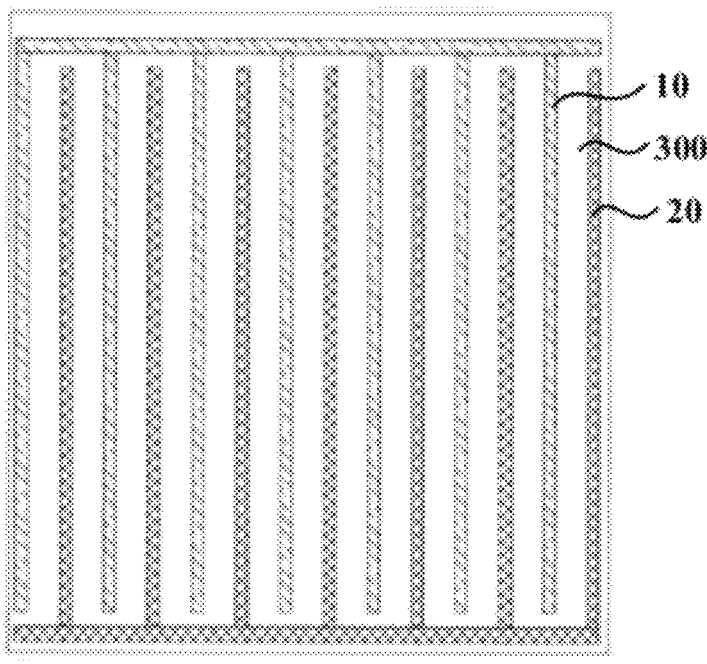
FIG. 21 is a schematic top view of a first surface of a back contact solar cell according to an embodiment of the present application.

FIG. 21 is a schematic top view of a first surface of a back contact solar cell according to an embodiment of the present application.

According to an example embodiment of the present application, referring to FIG. 20 and FIG. 21, the present application provides a back contact solar cell.

According to an embodiment of the present application, the first surface A of the semiconductor substrate 1 has an electrode collection region. The electrode collection region includes a plurality of minority-carrier regions 100 and a plurality of majority-carrier regions 200 that are alternately distributed along the second direction, and an isolation region 300 exists between a minority-carrier region 100 and a majority-carrier region 200 that are adjacent.

According to an embodiment of the present application, the first doped semiconductor layer 3 includes a plurality of third doped semiconductor layers 31 and a plurality of fourth doped semiconductor layers 32. The plurality of third doped semiconductor layers 31 configured to collect and export the minority of carriers are arranged in the minority-carrier region 100. The plurality of fourth doped semiconductor layers 32 configured to collect and export the majority carriers are arranged in the majority-carrier region 200. A conductive type of the third doped semiconductor layers 31 is opposite to that of the fourth doped semiconductor layers 32. One of each of the plurality of third doped semiconductor layers 31 and each of the plurality of fourth doped semiconductor layers 32 is N-type doped, and the other of the third doped semiconductor layer 31 and the fourth doped semiconductor layer 32 is P-type doped. For example, the conductive type of the third doped semiconductor layers 31 may be the N-type. In this case, the conductive type of the fourth doped semiconductor layers 32 is the P-type. Alternatively, the conductive type of the third doped semiconductor layers 31 may be the P-type. In this case, the conductive type of the fourth doped semiconductor layers 32 is the N-type.

According to an embodiment of the present application, referring to FIG. 20 and FIG. 21, the plurality of third doped semiconductor layers 31 extend in the first direction in a first plane parallel to the first surface A.

According to an embodiment of the present application, the plurality of fourth doped semiconductor layers 32 extend in the first direction. The plurality of third doped semiconductor layers 31 and the plurality of fourth doped semiconductor layers 32 are alternately distributed at intervals on the first surface A in the second direction that is perpendicular to the first direction and that is on the first plane.

According to an embodiment of the present application, the third doped semiconductor layers 31 and the fourth doped semiconductor layers 32 are further located on a part of the surface of the first region C1.

According to an embodiment of the present application, the third doped semiconductor layer 31 located in a minority-carrier region 100 located at an extreme edge of the semiconductor substrate 1 vertically extends from the first plane to a part of the surface of the first region C1 of the side surface C; and/or the fourth doped semiconductor layer 32 located in a majority-carrier region 200 located at an extreme edge of the semiconductor substrate 1 vertically extends from the first plane to a part of the surface of the first region C1 of the side surface C.

According to an embodiment of the present application, a first interface passivation layer is further formed between the semiconductor substrate 1 and the third doped semiconductor layer 31. A second interface passivation layer is further formed between the semiconductor substrate 1 and the fourth doped semiconductor layer 32.

According to an embodiment of the present application, the first interface passivation layer and/or the second interface passivation layer include one or more of silicon nitride, silicon oxide, silicon oxynitride, aluminum oxide, silicon carbide, and amorphous silicon.

According to an embodiment of the present application, the first passivation anti-reflection layer 4 of the back contact solar cell is located on surfaces that are of the third doped semiconductor layer 31 and the fourth doped semiconductor layer 32 and that are away from the semiconductor substrate 1, and on the semiconductor substrate 1 of the isolation region 300. A material of the first passivation anti-reflection layer 4 includes one or more of silicon nitride, silicon oxide, silicon oxynitride, aluminum oxide, silicon carbide, and amorphous silicon. The first passivation anti-reflection layer 4 is configured to implement passivation and anti-reflection functions on a surface of the back contact solar cell.

According to an embodiment of the present application, the back contact solar cell further includes: the first electrode 10. The first electrode 10 penetrates the first passivation anti-reflection layer 4 to be in electrical contact with the third doped semiconductor layer 31. The back contact solar cell further includes the second electrode 20. The second electrode 20 penetrates the first passivation anti-reflection layer 4 to be in electrical contact with the fourth doped semiconductor layer 32.

According to an embodiment of the present application, a width of the first electrode 10 ranges from 5 µm to 600 µm, for example, may be 5 µm, 10 µm, 100 µm, 500 µm, or 600 µm, but is not limited to the listed values.

According to an embodiment of the present application, a width of the second electrode 20 ranges from 5 µm to 600 µm, for example, may be 5 µm, 10 µm, 100 µm, 500 µm, or 600 µm, but is not limited to the listed values.

According to an embodiment of the present application, a material of the first electrode 10 and/or the second electrode 20 includes, but is not limited to, one or more of metal, metal oxide, metal nitride, metal carbide, and metal sulfides. The first electrode 10 and/or the second electrode 20 may alternatively be another conductive connection material such as graphene.

According to an embodiment of the present application, during preparation of an electrode, electrode slurry is coated on the first passivation anti-reflection layer 4 on the first surface A, and then sintering is performed, so that the electrode slurry passes through the first passivation anti-reflection layer 4 and contacts with a doped semiconductor layer.

According to an example embodiment of the present application, the present application provides a photovoltaic module, including the foregoing solar cell.

The objective, technical solutions, and beneficial effects of the present application are further described in detail by using the foregoing specific embodiments. It should be understood that only the specific embodiments of the present application are described above, but constitute no limitation on the present application. Any modification, equivalent replacement, and improvement made within the spirit and principle of the present application are included in the protection scope of the present application.

What is claimed is:

1. A solar cell, comprising:
a semiconductor substrate, wherein the semiconductor substrate comprises:
   a first surface and a second surface that are opposite to each other; and
   a plurality of side surfaces connected between the first surface and the second surface; and
a passivated contact structure located on at least a portion of the first surface, wherein the passivated contact structure comprises an interface passivation layer and a first doped semiconductor layer that are stacked sequentially, and a first portion of the first doped semiconductor layer is located on the portion of the first surface,
wherein a side surface of the plurality of side surfaces comprises a first region and a second region that are arranged along a first direction from the first surface to the second surface, the first region protrudes in a second direction away from the side surface relative to the second region,
wherein a second portion of the first doped semiconductor layer is located on a first portion of a surface of the first region, the second portion of the first doped semiconductor layer is integrally continuous with the first portion of the first doped semiconductor layer,
wherein a second portion of the surface of the first region adjacent to the second region is uncovered by the first doped semiconductor layer, and
wherein a distance between the second portion of the first doped semiconductor layer and the second region along the first direction is greater than or equal to 1 µm.

2. The solar cell according to claim 1, wherein
a ratio between a width of the first region in a direction perpendicular to the first surface and a thickness of the semiconductor substrate ranges from 1% to 20%.

3. The solar cell according to claim 1, wherein
a width of the first region in a direction perpendicular to the first surface ranges from 0.5 µm to 20 µm.

4. The solar cell according to claim 1, wherein, in a direction perpendicular to the first surface, a distribution width of the first doped semiconductor layer in the first region is less than 80% of a width of the first region.

5. The solar cell according to claim 1, wherein
a first region of at least one of the plurality of side surfaces is an inclined surface extending, in the second direction, from a side away from the first surface to a side close to the first surface.

6. The solar cell according to claim 1, wherein the first region comprises an edge extending parallel to the first surface.

7. The solar cell according to claim 1, wherein
a plurality of holes are provided in the first region, the plurality of holes recess into the semiconductor substrate in a direction parallel to the first surface.

8. The solar cell according to claim 7, wherein a distribution density of the plurality of holes in a region close to the first surface is less than a distribution density of the plurality of holes in a region close to the second region.

9. The solar cell according to claim 8, wherein
a radial size of the plurality of holes gradually decreases in a direction from the surface of the first region to the semiconductor substrate; and
the radial size of the plurality of holes is less than 5 µm.

10. The solar cell according to claim 1, further comprising:
a second doped semiconductor layer, at least located on the second surface of the semiconductor substrate; and
a second passivation anti-reflection layer, at least located on a surface of the second doped semiconductor layer facing away from the semiconductor substrate.

11. The solar cell according to claim 1, wherein the solar cell is a back contact solar cell, and
wherein the first doped semiconductor layer comprises a plurality of third doped semiconductor layers and a plurality of fourth doped semiconductor layers, the plurality of third doped semiconductor layers and the plurality of fourth doped semiconductor layers are alternately distributed on the first surface, wherein
one of the plurality of third doped semiconductor layers and the plurality of fourth doped semiconductor layers is N-type doped, and other one of the plurality of third doped semiconductor layers and the plurality of fourth doped semiconductor layers is P-type doped.

12. The solar cell according to claim 1, further comprising:
a first passivation anti-reflection layer, at least located on a surface of the passivated contact structure facing away from the semiconductor substrate; and
a first electrode, wherein the first electrode penetrates the first passivation anti-reflection layer and is in contact with the first doped semiconductor layer, wherein
a distance between the first electrode and the first region in a direction parallel to the first surface is greater than or equal to 300 µm.

13. The solar cell according to claim 1, wherein:
the side surface further comprises a third region adjacent to the second region, the third region is closer to the second surface than the second region; and the third region protrudes in the second direction relative to the second region, and a protrusion height of the third region is greater than a protrusion height of the first region.

14. A photovoltaic module, comprising a solar cell, wherein the solar cell comprises:

a semiconductor substrate, wherein the semiconductor substrate comprises:

a first surface and a second surface that are opposite to each other, and a plurality of side surfaces connected between the first surface and the second surface; and a passivated contact structure located on at least a portion of the first surface, wherein the passivated contact structure comprises an interface passivation layer and a first doped semiconductor layer that are stacked sequentially, and a first portion of the first doped semiconductor layer is located on the portion of the first surface:

wherein a side surface of the plurality of side surfaces comprises a first region and a second region that are arranged along a first direction from the first surface to the second surface, the first region protrudes in a second direction away from the side surface relative to the second region, wherein a second portion of the first doped semiconductor layer is located on a first portion of a surface of the first region, the second portion of the first doped semiconductor layer is integrally continuous with the first portion of the first doped semiconductor layer, wherein a second portion of the surface of the first region adjacent to the second region is uncovered by the first doped semiconductor layer, and wherein a distance between the second portion of the first doped semiconductor layer and the second region along the first direction is greater than or equal to 1 μm.

* * * * *